(12) United States Patent
Helfinstine

(10) Patent No.: US 6,806,751 B2
(45) Date of Patent: Oct. 19, 2004

(54) LOOP FILTER FOR A PHASE-LOCKED LOOP AND METHOD FOR SWITCHING

(75) Inventor: Charles Allen Helfinstine, Santa Clara, CA (US)

(73) Assignee: Foundry Networks, Inc., Alviso, CA (US)

( * ) Notice: Subject to any disclaimer, the term of this patent is extended or adjusted under 35 U.S.C. 154(b) by 0 days.

(21) Appl. No.: 10/243,193

(22) Filed: Sep. 12, 2002

(65) Prior Publication Data

US 2004/0051570 A1 Mar. 18, 2004

(51) Int. Cl.$^7$ ................................................ H03L 7/00
(52) U.S. Cl. ...................... 327/156; 327/552; 375/376; 331/DIG. 2
(58) Field of Search ................................. 327/146–149, 327/156–158, 551–559; 375/373–376; 331/DIG. 2, 1 A, 17

(56) References Cited

U.S. PATENT DOCUMENTS

| | | | | |
|---|---|---|---|---|
| 3,944,940 A | * | 3/1976 | Desai ............................ | 360/51 |
| 4,547,747 A | * | 10/1985 | Wolaver et al. ................ | 331/17 |
| 4,682,116 A | * | 7/1987 | Wolaver et al. ................ | 327/5 |
| 4,748,419 A | * | 5/1988 | Somerville .................... | 330/10 |
| 5,260,979 A | | 11/1993 | Parker et al. ................. | 375/108 |
| 5,355,090 A | | 10/1994 | Pajowski et al. ............. | 327/292 |
| 5,726,607 A | | 3/1998 | Brede et al. .................. | 331/2 |
| 5,783,971 A | * | 7/1998 | Dekker ......................... | 331/17 |
| 6,359,945 B1 | | 3/2002 | Doblar ......................... | 375/357 |
| 6,366,146 B2 | | 4/2002 | Fredriksson ................. | 327/156 |

* cited by examiner

Primary Examiner—Minh Nguyen
(74) Attorney, Agent, or Firm—Thelen Reid & Priest LLP; David B. Ritchie

(57) ABSTRACT

A phase-locked loop having a phase detector for receiving a feedback signal and an input clock signal having an input clock frequency. The phase detector outputs or produces a phase error signal indicative of a comparison between the input clock signal and the feedback signal. The phase-locked loop also has a loop filter coupled to the phase detector to receive the phase error signal and to output an error correction signal which includes an error correction frequency having a value ranging from about [input clock frequency−(input clock frequency×about 0.00015)] to about [input clock frequency+(input clock frequency×about 0.00015)]. A voltage controlled oscillator is coupled to the loop filter for receiving the error correction signal and to generate an output signal of the phase-locked loop which is indicative of the feedback signal. A method for operating a phase-locked loop circuit is provided along with a filter circuitry for a phase-locked loop and a method for filtering a phase error signal.

17 Claims, 4 Drawing Sheets

PLL Loop Filter

LOOP FILTER FOR A PHASE-LOCKED LOOP AND METHOD FOR SWITCHING

BACKGROUND OF THE INVENTION

1. Field of the Invention

Embodiments of the present invention relate generally to phase-locked loops. More particularly, embodiments of the present invention provide a loop filter for phase-locked loops and a method for providing a smooth transition when switching between reference clock signals.

2. Description of the Background Art

A phase-locked is the state of synchronization between two signals (e.g., two AC signals) in which they generally remain at the same frequency and with general constant phase difference. Phase-locked is typically applied to a circuit that synchronizes a variable oscillator with an independent signal. Thus, phase-locked pertains to two signals whose phases relative to each other are kept constant by a controlling device. Phase-locked loops are found in a myriad of electronic applications, such as communication receivers and clock synchronization circuits in computer systems for providing a reference signal with a known phase for clocking incoming and out-going data. A phase-locked loop may be broadly described as a circuit for synchronizing a variable local oscillator with the phase of a transmitted signal. It may be more specifically described as a frequency-selective circuit comprising a phase detector (e.g., a phase comparator), a loop filter, and a voltage controlled oscillator (VCO) connected in an arrangement which allows a feed back to the phase detector.

When a reference clock signal is applied to a phase-locked loop, the phase detector compares the phase of the reference signal with the phase of the voltage controlled oscillator output signal and generates an error voltage signal that is related to a phase difference between the reference clock signal and the output signal from the voltage controlled oscillator. This error voltage signal is subsequently filtered in the loop filter and then amplified by an amplifier.

The amplified voltage signal is then applied to the voltage controlled oscillator, thus forcing the frequency of the voltage controlled oscillator to vary in a direction that generally approximates the reference signal frequency. When the voltage controlled oscillator output frequency is in close approximation to the reference signal frequency, the feed back arrangement of the phase-locked loop causes the voltage control oscillator to generally synchronize or to generally "lock" to the reference signal frequency. Therefore, "phase-locked" is achieved by feeding the output of the voltage controlled oscillator back to the phase detector so that a continual error correction may be performed.

The generally self-correcting nature of a phase-locked loop thus permits a system to track any frequency changes of the reference signal once it is locked. However, a phase discontinuity which occurs when switching of clock outputs may be too eruptive for the purpose of the output voltage signal leaving the voltage controlled oscillator. It is desirable to have a smooth phase transition when switching between a reference clock signal and the output signal from the voltage controlled oscillator, especially while being able to compensate for large differences between the reference clock signal and the output signal from the voltage controlled oscillator when initially attempting to "lock" on the incoming reference clock signal. Thus, it is not desirable for the phase-locked loop to react too quickly or to over-correct to large perturbations in the reference clock signal.

SUMMARY OF EMBODIMENTS OF THE INVENTION

Embodiments of the present invention provide a method for operating a phase-locked loop circuit comprising: detecting a phase difference between a feedback signal and an input clock signal having an input clock frequency, producing a phase error signal indicative of the phase difference, and converting the phase error signal into an error correction signal including an error correction frequency having a value approximating the input clock frequency+/−(input clock frequency×a factor ranging from about 0.0001 to about 0.0010). The method for operating a phase-locked loop circuit may also comprise producing an oscillation signal in response to the error correction signal, wherein the oscillation signal is indicative of the feedback signal.

Embodiments of the present invention also provide a method for a phase-locked loop comprising a phase detector receiving a feedback signal and an input clock signal having an input clock frequency and outputting a phase error signal indicative of a comparison between said input clock signal and said feedback signal. A loop filter is coupled to the phase detector to receive the phase error signal and to output an error correction signal having an error correction frequency with a value approximating the input clock frequency+/−(input clock frequency×a factor ranging from about 0.0001 to about 0.0010). The phase-locked loop also comprises a voltage controlled oscillator coupled to the loop filter for receiving the error correction signal and to generate an output signal of the phase-locked loop which is indicative of the feedback signal.

Additional embodiments of the present invention provide a filter/circuitry for a phase-locked loop comprising an amplifier, a first parallel circuit assembly coupled to the amplifier, and a second parallel circuit assembly coupled to the first parallel circuit assembly and connecting across the amplifier.

Further additional embodiments of the present invention provide a method for filtering a phase error signal in a phase-locked loop comprising passing at least part of a phase error signal through a first parallel circuit assembly, amplifying at least part of the phase error signal to produce an error correction signal, passing at least part of the phase error signal through a second parallel circuit assembly, and combining the error correction signal with at least part of the phase error signal which passed through the second parallel circuit assembly.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

DETAILED DESCRIPTION OF EMBODIMENTS OF THE INVENTION

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Figure 1:
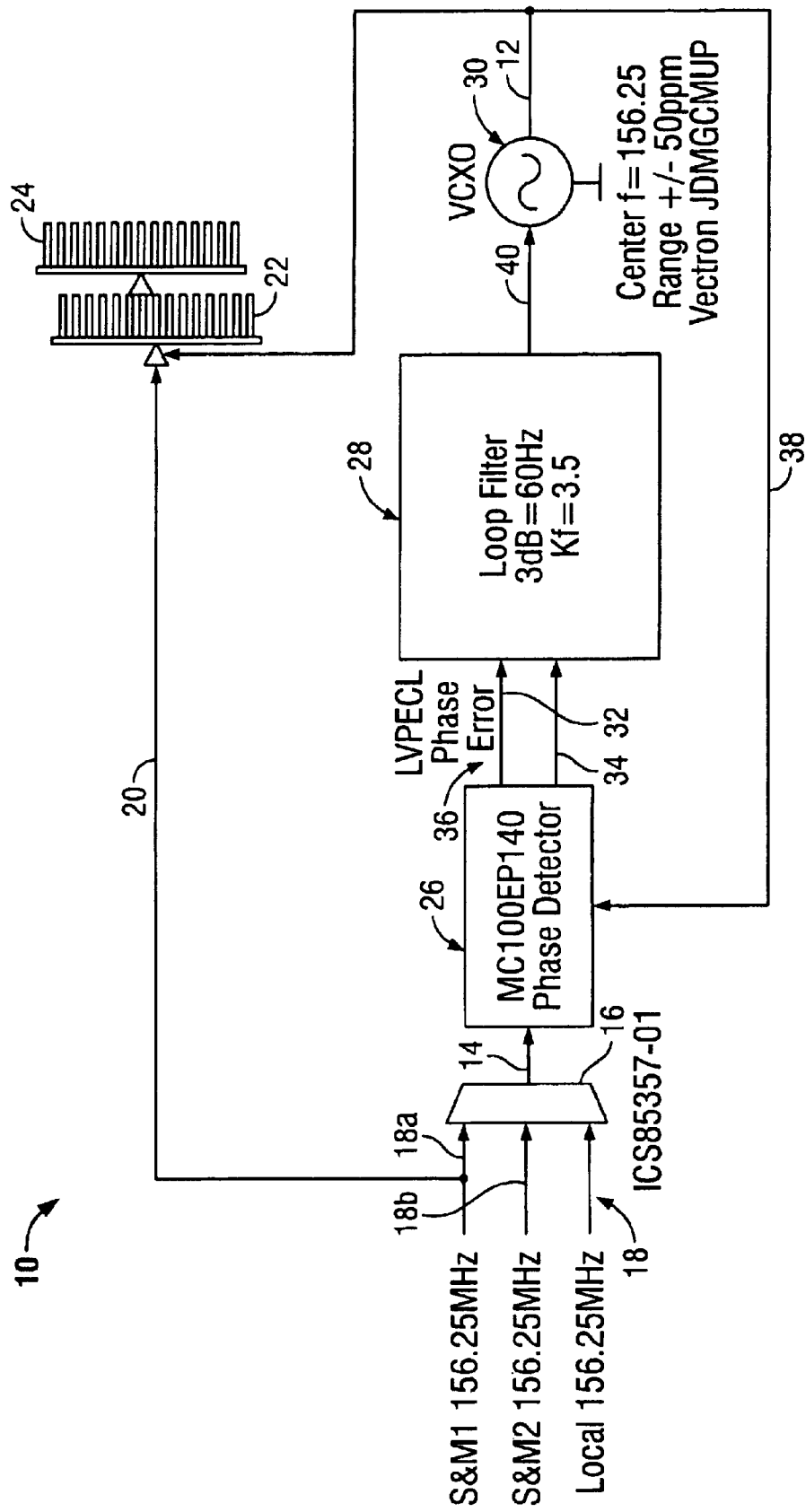
FIG. 1 is schematic block-flow diagram illustrating an embodiment of the present invention.

Referring in detail now to FIG. 1 for illustration of embodiments of the present invention, there is seen a schematic block diagram of an embodiment of a phase-locked loop, generally illustrated as 10. As best shown in FIG. 1, the phase-locked loop 10 is configured to generate an output clock signal 12 in response to at least one input clock signal 14 that emanates from a multiplexer 16 which receives at least one reference clock signal, preferably a plurality of reference clock signals, generally illustrated as 18. A by-pass line 20 extends from reference clock signals 18 to serially disposed fan-out buffers 22 and 24.

The phase-locked loop 10 includes a phase detector 26, a loop filter 28, and a voltage controlled oscillator 30 (such as oscillator JDMGCMUP by Vectron). A feed back signal 38 generally passes from the output clock signal 12 back to the phase detector 26 so that an on-going error correction may be performed by the phase detector 26. Input clock signal 14 is received by the phase detector 26 which subsequently produces output clock signals 32 and 34. Phase detector 26 measures the phase difference between input clock signal 14 and output clock signal 12/feed back signal 38, and generates a phase error signal 36 (e.g., a difference in potential indicating a phase differential) as a combination of UP and/or DOWN pulses which are typically digital signals indicative of the phase difference between the input clock signal 14 and the feed back signal 38. The UP pulse may be indicative of a phase differential between feed back signal 38 and the input clock signal 14 when an edge of the feedback signal 38 occurs after a corresponding edge of the input clock signal 14. The DOWN pulse may be indicative of a phase differential between the feedback signal 38 and the input clock signal 14 when an edge of the feedback signal 38 occurs before a corresponding edge of the input clock signal 14. As input clock signal 14 and output clock signal 12 change with respect to each other, phase error signal 36 becomes a time-varying signal into the loop filter 28.

The loop filter 28 for various embodiments of the present invention governs the response of the phase-locked loop 10 to the error detected between the input clock signal 14 and the feed back signal 38. As best shown in FIG. 1, the loop filter 28 generates an error voltage signal 40 which is the input signal to the voltage controlled oscillator 30. The loop filter 28 permits the phase-locked loop 10 to generate output clock signal 12 which generally matches the input clock signal 14 in frequency and phase within defined tolerances. Thus, the loop filter 28 permits the output clock signal 12 to rapidly converge (e.g., in about 1 microseconds or less) on the frequency of the input clock signal 14 to allow a smooth transition from the input clock signal 14 to the output clock signal 12. Stated alternatively, the loop filter 28 for various embodiments of the present invention enables the phase-locked loop 10 to generate a clock source (e.g., the output clock signal 12) that may switch between or from a plurality of clock signals 18 (e.g., two or more clock signals having a frequency of about 156.25 MHz) to an output clock signal 12/feedback signal 38 without exceeding any frequency tolerances required by or at the output clock signal 12/feedback signal 38.

The clock signals 18 may be phase and frequency skewed from each other by the following limits: (i) a phase skewed from about +/−60 degrees to about +/−300 degrees, more preferably from about +/−120 degrees to about +/−240 degrees, most preferably from about +/−160 degrees to about +/−200 degrees (e.g., about +/−180 degrees); and (ii) a frequency skewed from a base clock rate ranging from about +/−0.001% (e.g., an accuracy of about +/−10 parts per million) to about +/−0.010% (e.g., an accuracy of about +/−100 parts per million), more specifically from about +/−0.003% (e.g., an accuracy of about +/−30 parts per million) to about +/−0.007% (e.g., an accuracy of about +/−70 parts per million), more specifically further from about +/−0.004% (e.g., an accuracy of about +/−40 parts per million) to about +/−0.006% (e.g., an accuracy of about +/−60 parts per million). For incoming reference clock signals 18$a$ and 18$b$ (see FIG. 1), the skewed frequency may be +/−50 parts per million or +/−7812 Hz for a base clock frequency (or clock rate) of 156 MHz, and the skewed phase may be +/−180 degrees.

Figure 2:
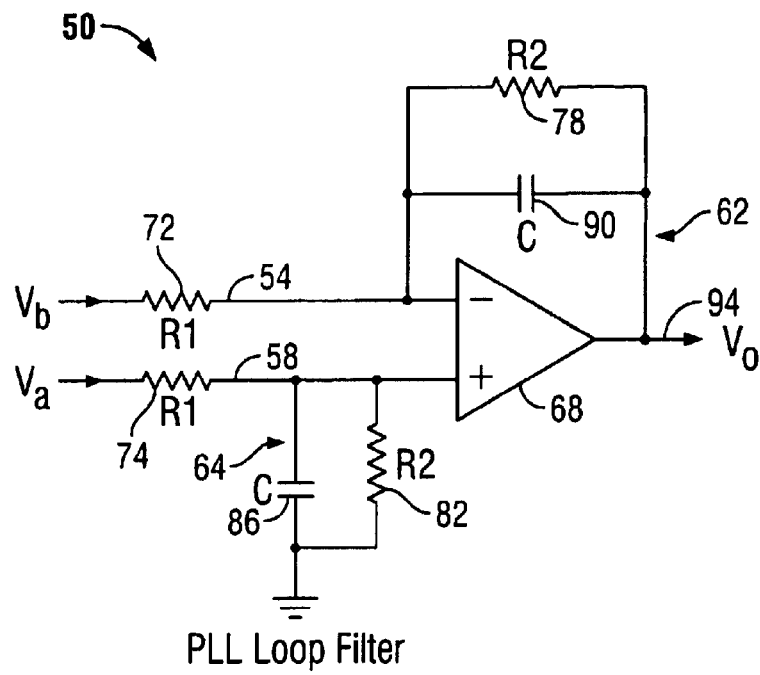
FIG. 2 is an embodiment of the circuit diagram of the loop filter.

Referring now to FIG. 2, there is illustrated a circuitry 50 for the loop filter 28 for various embodiments of the invention. The circuitry 50 comprises parallel conductors 54 and 58 coupling to an amplifier 68 having conductor 94 extending therefrom. Conductors 54 and 58 respectively include resistors 72 and 74. The circuitry 50 also comprises a pair of parallel circuit assemblies 62 and 64. Parallel circuit assembly 62 includes resistor 78 and capacitor 90 in parallel, and cross-connects over amplifier 68 from conductor 54 to conductor 94 where through error voltage signal 40 passes. Parallel circuit assembly 64 includes resistor 82 and capacitor 86 in parallel, and connects from conductor 58 to ground. As shown in FIG. 2, parallel circuit assembly 64 connects to conductor 58 at a point between resistor 74 and amplifier 68.

Suitable values for resistors 72, 74, 78, and 82, and for capacitors 86 and 90 preferably produce the following results: (i) a DC voltage gain of about 5 since the phase detector 26 has a small voltage output swing and must be amplified by amplifier, and a minimum fail-over time of about 640 ns. The minimum fail-over time of about 640 ns translates into an approximate 400 kHz bandwidth for the loop filter 28. Employing the transfer function of the loop filter 28 with a gain of about 5 and an approximate 400 kHz −3 dB point yields the following suitable resistor and capacitor values:

$$Vo \text{ (loop filter 28 gain)} = \frac{R_2}{R_1 + R_1 R_2 C} (Va - Vb)$$

$$K \text{ (DC voltage gain)} = 5 = \frac{R_2}{R_1} \quad -3\text{dB} = 400 \text{ kHz} = \frac{\sqrt{2}(R_2 - R_1)}{R_1 R_2 C}$$

wherein: Va−Vb represents a difference in potential between conductors 54 and 58, $R_1$ represents resistor 72 or resistor 74 (resistors 72 and 74 may be equal or the same), $R_2$ represents resistor 78 or resistor 82 (resistors 78 and 82 may be equal or the same), and C represents capacitor 86 or capacitor 90 (capacitors 86 and 90 may be equal or the same).

Combining the DC voltage gain equation and the −3 dB point equation yields the following two equations (A) and (B):

$$R_1 = \frac{\sqrt{2}}{5E5C} \quad \text{(A)}$$

$$R_2 = 5 \times R_1 \quad \text{(B)}$$

These two equations (A) and (B) with three variables (i.e., variable $R_1$, $R_2$ and C) describe suitable component values in the loop filter circuit 50 of FIG. 2.

For various embodiments of the present invention, the value for resistors 72 and 74 may broadly range from about 2.83 Ohms to about 2.8M Ohms (2.8×10⁶ Ohms). More specifically, the value for resistors 72 and 74 may range from about 22K ohms to about 34K ohms, more preferably from about 24K ohms to about 32K ohms, most preferably from about 26K ohms to about 30K ohms (e.g., from about 27.5K ohms to about 28K ohms, such as about 28K ohms). It has also been determined for various embodiments of the invention that the value for resistors 78 and 82 may broadly range from about 14.14 Ohms to about 14.14M Ohms. More specifically, the value of resistors 78 and 82 may range from about 2.0K ohms to about 3.0K ohms, more preferably from about 2.2K ohms to about 2.8K ohms, most preferably from about 2.5K ohms to about 2.7K ohms (e.g., from about 2.6K ohms to about 2.7K ohms, such as about 2610 ohms).

It has further also been determined for various embodiments of the invention that the value for capacitors 86 and 90 may vary from about 1 microFarad to about 1 pFarad ($1^{10-12}$ Farads). More specifically, the value for capacitors 86 and 90 may vary from about 1 pFarad to about 1 microFarad, more preferably from about 100 pFarads to about 0.10 microFarads, most preferably from about 1000 pFarads to about 0.01 microFarads. Such an amplifier 68 may be purchased commercially from Analog Devices, Inc. under the product number or designation AD8061.

The circuitry 50 determines the frequency or clock rate that the phase-locked loop 10 skews the output clock source (i.e., the output clock signal 12) on a switch over. By assigning appropriate values for the circuit elements (i.e., the resistors and the capacitors) in the circuitry 50, the phase-locked loop 10 during a reference clock switch-over will produce or generate an error voltage signal 40 which passes subsequently through voltage controlled oscillator 30 to produce a clock signal (i.e., output clock signal 12) having close tolerances or minimal skewness vis-a-vis the input clock signal 14.

It has been determined that the circuitry 50 of FIG. 2 produces a frequency, skewed from the frequency of input clock signal 14, at less than about +/−0.015% from the frequency of the input clock signal 14. It has been more specifically determined that the circuitry 50 of FIG. 2, particularly when the previously mentioned circuit element values are employed for the resistors and capacitors, produces a frequency, skewed from the frequency of the input clock signal 14, at a value ranging from about +/−0.001% (e.g., an accuracy of about +/−10 parts per million) to about +/−0.010% (e.g., an accuracy of about +/−100 parts per million), more specifically from about +/−0.003% (e.g., an accuracy of about +/−30 parts per million) to about +/−0.007% (e.g., an accuracy of about +/−70 parts per million), more specifically further from about +/−0.004% (e.g., an accuracy of about +/−40 parts per million) to about +/−0.006% (e.g., an accuracy of about +/−60 parts per million). For incoming reference clock signals 18a and 18b (see FIG. 1), each having a frequency of 156 MHz, the phase-locked loop 10 during a reference clock switch-over will create output clock signal 12 having a frequency of about +/−50 parts per million accuracy or about +/−7812 Hz of 156 MHz.

The settling time for the phase-locked loop 10 to make a reference clock switchover from the input clock signal 14 is about 1.5 microseconds or less, or about 1.0 microseconds or less, such as from about 0.10 microseconds to about, or less than about, 1.0 microseconds, more specifically from about 0.4 microseconds to about, or less than about, 1.0 microseconds, or more specifically further from about 0.6 microseconds to about, or less than about, 1.0 microseconds.

Referring now to FIGS. 3 through 7, there is seen a simulation of the circuitry 50 of FIG. 2 for 156.25 MHz incoming reference clock signals 18a, 18b and for the elements of the circuitry 50 having the following values: resistors 72, 74 are 28 Ohms; resistors 78, 82 are 140 Ohms; and capacitors 86 and 90 are 0.1 microFarads. The amplifier 68 may be an amplifier from Analog Devices, Inc. sold under the product number or designation AD8061.

Figure 3A:
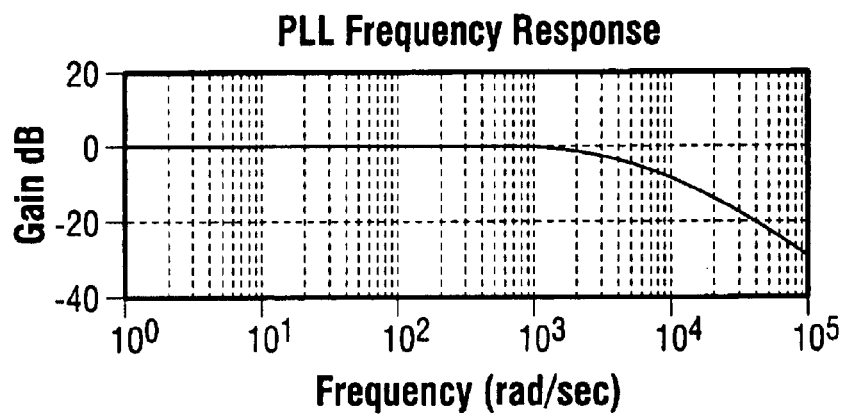
FIG. 3 is a phase-locked loop frequency vs. phase response chart.
Figure 3B:
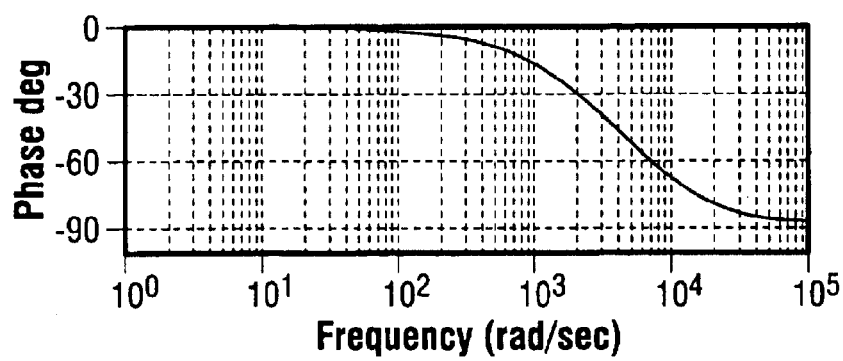
Figure 4:
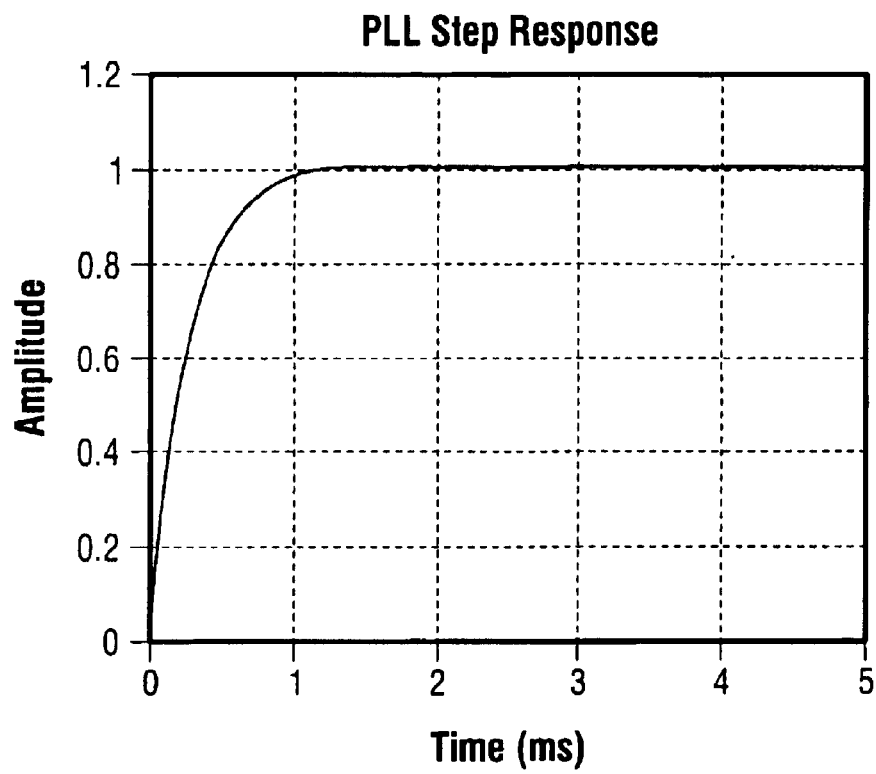
FIG. 4 is a phase-locked loop response graph of time (sec.) vs. amplitude.
Figure 5:
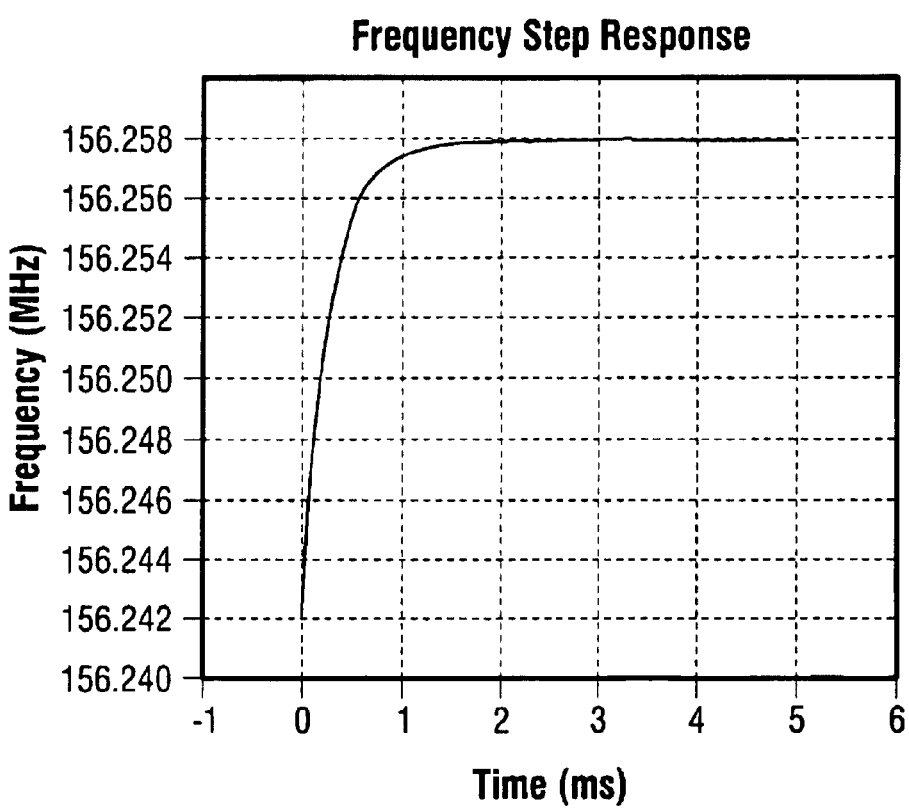
FIG. 5 is a phase-locked loop output clock frequency step response graph of time (ms) vs. frequency (MHz).
Figure 6:
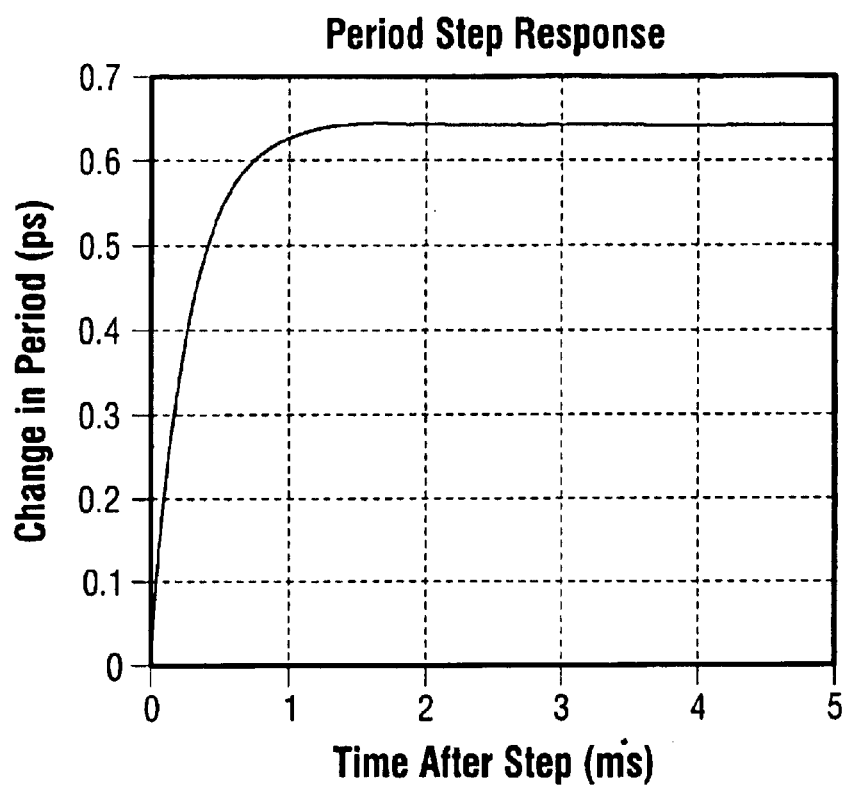
FIG. 6 is a phase-locked loop output clock phase step response graph of Time after Step (ms) vs. Change in Period (ps).
Figure 7:
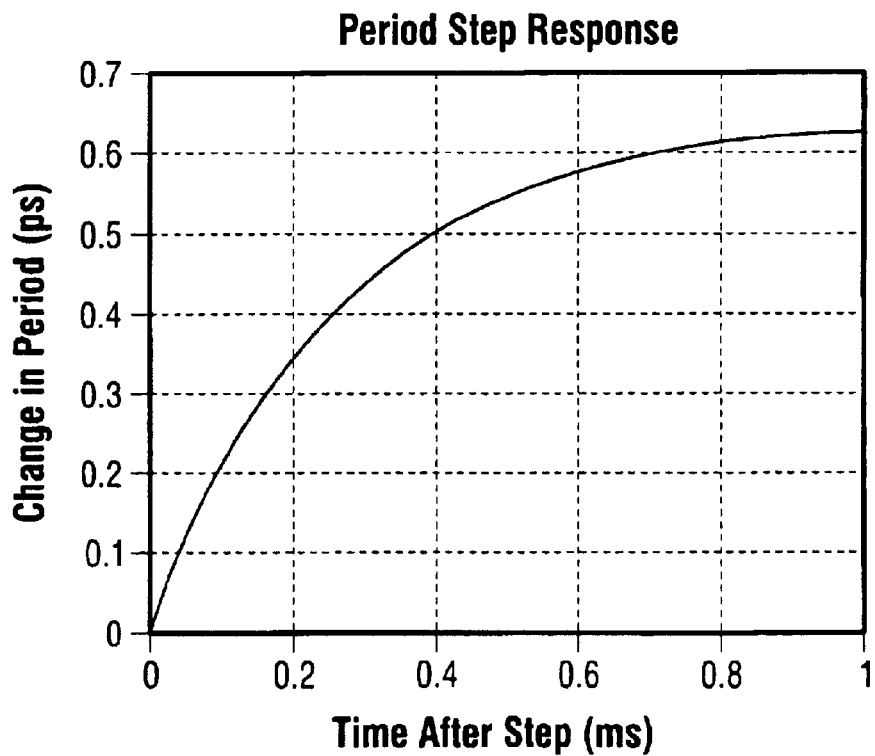
FIG. 7 is an enlarged view of part of the graph in FIG. 6.

There is seen in FIG. 3 phase-locked loop frequency (rad/sec) vs. gain (dB), and phase-locked loop frequency (rad/sec) vs. phase (degrees). FIG. 4 is a graph of amplitude vs. time (secs) for representing phase-locked loop response. FIG. 5 is a graph of frequency (MHz) vs time (microsecs) for representing phase-locked loop output clock frequency step response. FIG. 6 is a graph of change-in-period (ps) vs. time (microsecs) for representing phase-locked loop output clock phase/period response. FIG. 7 is an enlarged graph of the graph of FIG. 6 for a time of 1.0 microseconds.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, by modem, and the like. It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A phase-locked loop comprising:

a selector receiving a first clock signal at a first input and a second clock signal at a second input and outputting an input clock signal at an output, wherein one of said first and second inputs is selectively coupled to said output;

a phase detector receiving a feedback signal at a first input and said input clock signal at a second input and outputting a phase error signal indicative of a comparison between said input clock signal and said feedback signal;

a loop filter receiving said phase error signal and outputting an error correction signal at an output, wherein said loop filter comprises:

an amplifier having a first input, a second input, and an output, wherein said output of said amplifier is coupled to said output of said loop filter;

a first resistor having a first lead, a second lead, and a first resistance value, wherein said first lead is coupled to a first input of said loop filter and said second lead is coupled to said first input of said amplifier;

a second resistor having a first lead, a second lead, and a second resistance value, wherein said first lead is coupled to a second input of said loop filter and said second lead is coupled to said second input of said amplifier;

a third resistor having a first lead, a second lead, and a third resistance value, wherein said first lead is coupled to said first input of said amplifier and said second lead is coupled to said output of said amplifier;

a first capacitor having a first lead, a second lead, and a first capacitance value, wherein said first lead is coupled to said first input of said amplifier and said second lead is coupled to said output of said amplifier;

a fourth resistor having a first lead, a second lead, and a fourth resistance value, wherein said first lead is coupled to said second input of said amplifier and said second lead is coupled to a reference potential; and a second capacitor having a first lead, a second lead, and a second capacitance value, wherein said first lead is coupled to said second input of said amplifier and said second lead is coupled to said reference potential; and a voltage controlled oscillator receiving said error correction signal at an input and generating an output clock signal of the phase-locked loop which is indicative of said feedback signal, wherein said first clock signal is produced by a first oscillator, said second clock signal is produced by a second oscillator, the nominal frequency of said first, second, and voltage controlled oscillators is substantially the same, and a frequency tolerance of said first and second oscillators is equal to or tighter than a frequency tolerance of said voltage controlled oscillator.

2. The phase-locked loop as defined in claim 1, wherein the selector comprises a multiplexer having a plurality of inputs and one output.

3. The phase-locked loop as defined in claim 1, wherein said input clock signal has a frequency, said error correction signal has a frequency, and said error correction signal frequency has a value ranging from about ((input clock signal frequency)−((input clock signal frequency)(about 0.00015))) to about ((input clock signal frequency)+((input clock signal frequency)(about 0.00015))).

4. The phase-locked loop as defined in claim 1, wherein said input clock signal has a frequency, said error correction signal has a frequency, and said error correction signal frequency comprises a value approximating the input clock signal frequency+/−((input clock signal frequency)(a factor ranging from about 0.0001 to about 0.0010)).

5. The phase-locked loop as defined in claim 1, wherein said input clock signal has a frequency, said error correction signal has a frequency, and said error correction signal frequency comprises a value approximating the input clock signal frequency+/−((input clock signal frequency)(a factor ranging from about 0.0003 to about 0.0007)).

6. The phase-locked loop as defined in claim 1, wherein said input clock signal has a frequency, said error correction signal has a frequency, and said error correction signal frequency comprises a value approximating the input clock signal frequency+/−((input clock signal frequency)(a factor ranging from about 0.0004 to about 0.0006)).

7. The phase-locked loop as defined in claim 6, wherein a settling time for said loop filter to convert said phase error signal into said error correction signal is less than about 1.5 microseconds.

8. The phase-locked loop as defined in claim 6, wherein a settling time for said loop filter to convert said phase error signal into said error correction signal ranges from about 0.10 microseconds to about 1.0 microseconds.

9. The phase-locked loop as defined in claim 6, wherein a settling time for said loop filter to convert said phase error signal into said error correction signal ranges from about 0.40 microseconds to about 1.0 microseconds.

10. The phase-locked loop as defined in claim 6, wherein a settling time for said loop filter to convert said phase error signal into said error correction signal ranges from about 0.60 microseconds to about 1.0 microseconds.

11. The phase-locked loop as defined in claim 1, wherein a settling time for said loop filter to convert said phase error signal into said error correction signal is less than about 1.5 microseconds.

12. The phase-locked loop as defined in claim 1, wherein a settling time for said loop filter to convert said phase error signal into said error correction signal ranges from about 0.10 microseconds to about 1.0 microseconds.

13. The phase-locked loop as defined in claim 1, wherein a settling time for said loop filter to convert said phase error signal into said error correction signal ranges from about 0.40 microseconds to about 1.0 microseconds.

14. The phase-locked loop as defined in claim 1, wherein a settling time for said loop filter to convert said phase error signal into said error correction signal ranges from about 0.60 microseconds to about 1.0 microseconds.

15. The phase-locked loop as defined in claim 1, wherein said input clock signal has a frequency, said error correction signal has a frequency, and said error correction signal frequency has an accuracy value which approximates the value of said input clock signal frequency by a value ranging from about +/−10 parts per million to about +/−100 parts per million.

16. The phase-locked loop as defined in claim 1, wherein said input clock signal has a frequency, said error correction signal has a frequency, and said error correction signal frequency has an accuracy value which approximates the value of said input clock signal frequency by a value ranging from about +/−40 parts per million to about +/−60 parts per million.

17. The phase-locked loop as defined in claim 1, wherein said first resistance value and said second resistance value are about the same, said third resistance value and said fourth resistance value are about the same, and said first capacitance value and said second capacitance value are about the same.

* * * * *